(12) United States Patent
Hosotani et al.

(10) Patent No.: US 8,786,038 B2
(45) Date of Patent: Jul. 22, 2014

(54) SEMICONDUCTOR STORAGE DEVICE AND METHOD OF MANUFACTURING THE SAME

(75) Inventors: Keiji Hosotani, Yokohama (JP); Hiroyuki Kanaya, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/230,746

(22) Filed: Sep. 12, 2011

(65) Prior Publication Data

US 2012/0068283 A1 Mar. 22, 2012

(30) Foreign Application Priority Data

Sep. 22, 2010 (JP) ................. 2010-212373

(51) Int. Cl.
*H01L 29/82* (2006.01)
*H01L 21/00* (2006.01)

(52) U.S. Cl.
USPC ................... 257/421; 257/300; 257/E21.665; 438/3

(58) Field of Classification Search
USPC .......... 257/211, 758, 300, E21.665, E27.087, 257/E27.104; 438/3
See application file for complete search history.

(56) References Cited

U.S. PATENT DOCUMENTS

| | | | |
|---|---|---|---|
| 6,518,588 B1* | 2/2003 | Parkin et al. ................. 257/3 |
| 6,573,586 B2* | 6/2003 | Sakata et al. ................ 257/529 |
| 6,650,513 B2* | 11/2003 | Fullerton et al. ............ 360/324.2 |
| 6,806,096 B1* | 10/2004 | Kim et al. .................... 438/3 |
| 6,853,580 B2 | 2/2005 | Nishimura |
| 6,888,742 B1 | 5/2005 | Nguyen et al. |
| 6,898,115 B2 | 5/2005 | Ikeda |
| 7,002,195 B2* | 2/2006 | Park ............................ 257/295 |
| 7,068,531 B2 | 6/2006 | Katti |
| 7,084,469 B2* | 8/2006 | Fukuzumi ..................... 257/421 |
| 7,239,545 B2 | 7/2007 | Hosotani |
| 7,630,232 B2 | 12/2009 | Guo |
| 7,646,051 B2* | 1/2010 | Ko ............................... 257/296 |
| 7,881,096 B2 | 2/2011 | Zhu et al. |
| 8,026,112 B2* | 9/2011 | Iba .............................. 438/3 |
| 2004/0145850 A1* | 7/2004 | Fukumoto et al. ............ 361/143 |

(Continued)

FOREIGN PATENT DOCUMENTS

| | | |
|---|---|---|
| JP | 2005-056976 A | 3/2005 |
| JP | 2006-190838 A | 7/2006 |
| JP | 2007-305629 | 11/2007 |

OTHER PUBLICATIONS

S. Mangin et al., "Current-induced magnetization reversal in nanopillars with perpendicular anisotropy," Nature Materials, vol. 5, Mar. 2006, pp. 210-215.

(Continued)

*Primary Examiner* — Cheung Lee
*Assistant Examiner* — Jeremy Joy
(74) *Attorney, Agent, or Firm* — Knobbe Martens Olson & Bear LLP

(57) ABSTRACT

A semiconductor storage device according to the present embodiment includes a selection element formed on a surface of a semiconductor substrate. A lower electrode is connected to the selection element. A magnetic tunnel junction element is provided on the lower electrode. An upper electrode is provided on the magnetic tunnel junction element. A growth layer is provided on the upper electrode and is composed of a conductive material and has a larger area than the upper electrode when viewed from above the surface of the semiconductor substrate. A wiring line is provided on the growth layer.

18 Claims, 4 Drawing Sheets

(56) References Cited

U.S. PATENT DOCUMENTS

| | | | |
|---|---|---|---|
| 2005/0219772 A1* | 10/2005 | Hayashi et al. | 360/324.2 |
| 2006/0054947 A1* | 3/2006 | Asao et al. | 257/295 |
| 2006/0056114 A1* | 3/2006 | Fukumoto et al. | 360/324.2 |
| 2009/0080239 A1 | 3/2009 | Nagase et al. | |
| 2009/0224342 A1 | 9/2009 | Nakayama et al. | |
| 2010/0020592 A1 | 1/2010 | Hosotani et al. | |
| 2010/0078763 A1 | 4/2010 | Hosotani et al. | |
| 2011/0037108 A1* | 2/2011 | Sugiura et al. | 257/295 |
| 2011/0121419 A1* | 5/2011 | Ueno et al. | 257/421 |
| 2011/0156181 A1* | 6/2011 | Takeuchi et al. | 257/421 |

OTHER PUBLICATIONS

M. Hosomi et al., "A Novel Nonvolatile Memory with Spin Torque Transfer Magnetization Switching: Spin-RAM," IEDM, Dec. 2005, pp. 459-462.

M. Durlam et al., "A 0.18 μm 4Mb Toggling MRAM," Electron Devices Meeting, 2003. IEDM '03 Technical Digest. IEEE International, pp. 34.6.1- 34.6.3, Dec. 2003.

R. Scheuerlein et al., "A 10ns Read and Write Non-Volatile Memory Array Using a Magnetic Tunnel Junction and FET Switch in each Cell," Technical Digest, ISSCC 2000, p. 128.

Notification of Reasons for Rejection mailed by Japan Patent Office on Mar. 8, 2011 in Japanese patent application No. 2008-250230. Background Art Information.

Yuasa et al., "Giant tunneling magnetoresistance in fully epitaxial in fully epitaxial body-centered-cubic Co/MgO/Fe magnetic tunnel junctions," Applied Physics Letters, 2005, pp. 222508-1-222508-3, vol. 87.

Tsunekawa et al., "Giant tunneling magnetoresistance effect in low-resistance CoFeB/MgO(001)/CoFeB magnetic tunnel junctions for read-head applications," Applied Physics Letters, 2005, pp. 072503-1-072503-3, vol. 87.

Oh et al., "On-axis scheme and Novel MTJ structure for sub-30nm Gb density STT-MRAM," 2010 IEEE International Electron Devices Meeting (IEDM), 2010, pp. 12.6.1-12.6.4.

Kubota et al., "Evaluation of Spin-Transfer Switching in CoFeB/ MgO/CoFeB Magnetic Tunnel Junctions," Japanese Journal of Applied Physics, 2005, pp. L1237-L1240, vol. 44—No. 40.

Kyowa Patent and Law Office, Information Sheet for Preparing an Information Disclosure Statement Under Rule 1.56, undated.

U.S. Appl. No. 12/559,446, filed Apr. 1, 2010, Hosotani et al.

Scheuerlein et al., "A 10ns Read and Write Non-Volatile Memory Array Using a Magnetic Tunnel Junction and FET Switch in Each Cell," ISSCC 2000 Technical Digest, p. 128.

Jeong et al., "Highly Scalable MRAM Using Field Assisted Current Induced Switching," 2005 Symposium on VLSI Technology Digest of Technical Papers, pp. 184-185.

U.S. Appl. No. 12/559,446, filed Sep. 14, 2009, Hosotani et al.

U.S. Appl. No. 12/510,063, filed Jul. 27, 2009, Hosotani et al.

Mangin et al., "Current-Induced Magnetization Reversal in Nanopillars with Perpendicular Anisotropy," Nature Materials vol. 5, Mar. 2006, pp. 210-215.

Yuasa et al., "Giant Tunneling Magnetoresistance in Fully Epitaxial Body-Centered-Cubic Co/MgO/Fe Magnetic Tunnel Junctions," Applied Physics Letters 87, 222508 (2005).

Tsunekawa et al., "Giant Tunneling Magnetoresistance Effect in Low-Resistance CoFeB/MgO(001)/CoFeB Magnetic Tunnel Junctions for Read-Head Applications," Applied Physics Letter 87, 072503 (2005).

Kubota et al., "Evaluation of Spin-Transfer Switching in CoFeB/ MgO/CoFeB Magnetic Tunnel Junctions," Japanese Journal of Applied Physics vol. 44, No. 40, 2005, pp. L1237-L1240.

Diao et al., "Spin Transfer Switching and Spin Polarization in Magnetic Tunnel Junctions with MgO and AlOx barriers," Applied Physics Letters 87, 232502 (2005).

Hosomi et al., "A Novel Nonvolatile Memory with Spin Torque Transfer Magnetization Switching: Spin-RAM," IEDM 2005 Proceedings, 2005.

Explanation of Non Patent Literature Documents.

Japanese Office Action for corresponding Japanese Application No. JP 2008-192529, mailed Jan. 22, 2013, in 6 pages.

* cited by examiner

US 8,786,038 B2

SEMICONDUCTOR STORAGE DEVICE AND METHOD OF MANUFACTURING THE SAME

CROSS REFERENCE TO RELATED APPLICATIONS

This application is based upon and claims the benefit of priority from the prior Japanese Patent Application No. 2010-212373, filed on Sep. 22, 2010, the entire contents of which are incorporated herein by reference.

FIELD

The embodiment of the present invention relates to a semiconductor storage device and a method of manufacturing the same.

BACKGROUND

As a resistance change type element that stores data utilizing a change in the resistance of the element, a Magnetic Random Access Memory (MRAM) has been developed. MRAM writing schemes include a magnetic field writing scheme and a spin injection writing scheme. In the magnetic field writing scheme, if the size of an MTJ (Magnetic Tunnel Junction) element is reduced, then holding power increases and thus there is a tendency of an increase in write current. On the other hand, in the spin injection writing scheme, since a Spin Transfer Torque (STT) writing scheme is used, the scheme has a characteristic that the smaller the size of a magnetic material, the lower the spin injection current required for magnetization reversal. Hence, an MTJ element of the spin injection writing scheme is advantageous in terms of achieving high integration, low power consumption, and high performance. In addition, although in the magnetic field writing scheme, erroneous writing to a non-selected memory cell may occur due to the spread of a magnetic field, in the spin injection writing scheme, such erroneous writing to a non-selected memory cell does not occur.

To achieve a fine MRAM, there is a need to adopt a spin injection type and promote the achievement of a finer MTJ element. However, to achieve a fine MTJ element, an MTJ film itself needs to be made thinner.

An MTJ element is formed in a manner such that a lower electrode layer, an MTJ film, an upper electrode layer, and a hard mask are deposited and are thereafter processed using lithographic and etching techniques. After processing the lower electrode layer, the MTJ film, and the upper electrode layer, a material of an interlayer dielectric film is deposited on the MTJ element. The interlayer dielectric film is etched back using a technique such as CMP (Chemical Mechanical Polishing) or dry etching, until a top surface of an upper electrode is exposed. Thereafter, a wiring line is formed on the upper electrode.

Since the interlayer dielectric film is etched back until the top surface of the upper electrode is exposed, the thinner the film thickness of the MTJ film, the thinner the film thickness of the interlayer dielectric film. When the interlayer dielectric film is too thin, there is a possibility that the wiring line connected to the upper electrode may be short-circuited to a lower electrode. In contrast, when the interlayer dielectric film is made sufficiently thick to prevent such a short-circuit, there is a possibility that the upper electrode may not be sufficiently exposed from the interlayer dielectric film, resulting in insufficient contact between the upper electrode and the wiring line. Namely, the promotion of the achievement of a fine MTJ element increases the possibility of the occurrence of a short-circuit between the upper electrode and the lower electrode or a contact failure between the upper electrode and the wiring line (e.g., a bit line).

DETAILED DESCRIPTION

A semiconductor storage device according to the present embodiment includes a selection element formed on a surface of a semiconductor substrate. A lower electrode is connected to the selection element. A magnetic tunnel junction element is provided on the lower electrode. An upper electrode is provided on the magnetic tunnel junction element. A growth layer is provided on the upper electrode and is composed of a conductive material and has a larger area than the upper electrode when viewed from above the surface of the semiconductor substrate. A wiring line is provided on the growth layer.

Embodiments will now be explained with reference to the accompanying drawings.

First Embodiment

Figure 1:
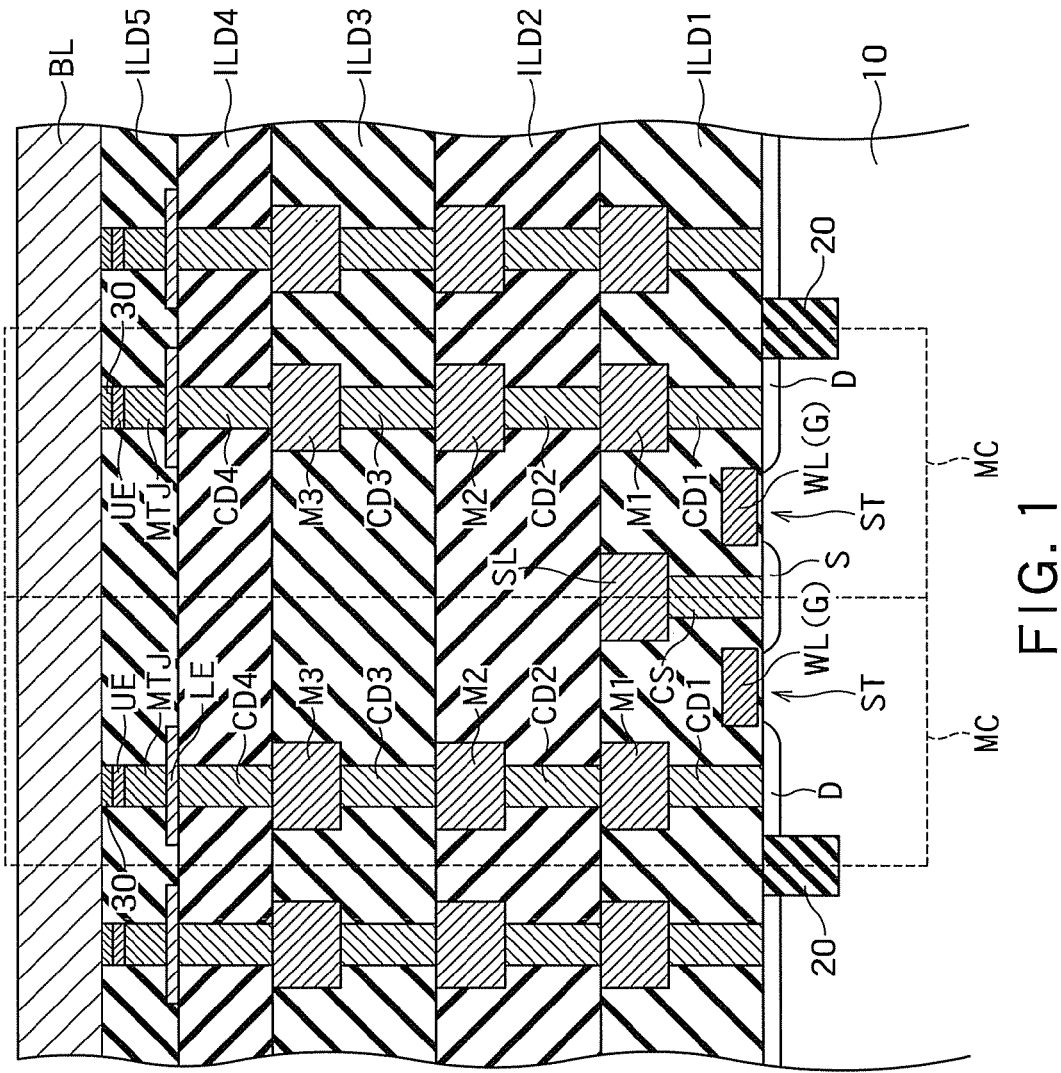
FIG. 1 is a cross-sectional view showing a configuration of an MRAM memory cell according to a first embodiment.

FIG. 1 is a cross-sectional view showing a configuration of an MRAM memory cell according to a first embodiment. An MRAM according to the present embodiment includes a selection transistor ST serving as a selection element, a magnetic tunnel junction element MTJ, a bit line BL, and a word line WL. One selection transistor ST and one MTJ element compose one memory cell MC. The selection transistor ST is formed in an active area of a surface of a semiconductor substrate 10. On a portion of the surface of the semiconductor substrate 10 other than the active area, an element isolation region (STI (Shallow Trench Isolation)) 20 is formed. The MTJ element and the selection transistor ST are connected in series between the bit line BL and a source line SL.

The selection transistor ST includes a gate electrode G (word line WL) and impurity diffusion layers (a source S and a drain D). The gate electrode G extends in a row direction (a direction perpendicular to the paper in FIG. 1) and also functions as the word line WL. The drain D is electrically connected to the bit line BL through drain contacts CD1 to CD4 and wiring lines (M1 to M3). The source S is electrically connected to the source line SL through a source contact CS. The source S, the source contact CS, and the source line SL are also used by an adjacent memory cell MC in a shared manner. The bit line BL is connected in a shared manner to memory cells MCs which are adjacent to each other in a column direction (a direction in which the bit line BL extends).

The gate electrode G is covered with an interlayer dielectric film ILD1. The interlayer dielectric film ILD1 fills an area between contacts CD1 and CS and an area between metal wiring layers M1. An interlayer dielectric film ILD2 fills an area between contacts CD2 and an area between metal wiring layers M2. An interlayer dielectric film ILD3 fills an area between contacts CD3 and an area between metal wiring layers M3. An interlayer dielectric film ILD4 fills an area between contacts CD4. Wiring formed by processing the metal wiring layers M1 to M3, the contacts CD1 to CD4, and the interlayer dielectric films ILD1 to ILD4 form a multilayer wiring structure.

A lower electrode LE is provided on the contact CD4 and the interlayer dielectric film ILD4 and is electrically connected to the drain D of the selection transistor ST. The material of the lower electrode LE is a conductive material and may be any of, for example, Ta, Al, Ir, and Zr.

Each MTJ element is provided on its corresponding lower electrode LE. An upper electrode UE is provided on the MTJ element and is electrically connected to the bit line BL. Namely, the MTJ element is connected between the lower electrode LE and the upper electrode UE. The MTJ element has a pinned layer, a tunnel barrier film, and a free layer stacked on top of each other in this order.

Next, the materials of the MTJ element will be described.

[In-Plane Magnetization Type Magnetic Tunnel Junction]

When the MTJ is an in-plane magnetization type magnetic tunnel junction, the materials of the pinned layer (fixed layer) and the free layer (recording layer) may be, for example, Fe, Co, Ni, or an alloy thereof. Furthermore, the materials of the pinned layer and the free layer may be, for example, oxides with high spin polarizability such as magnetite, $CrO_2$, and $RXMnO_{3-y}$ (R is a rare-earth metal and X is Ca, Ba, or Sr). Furthermore, the materials of the pinned layer and the free layer may be, for example, Heusler alloys such as NiMnSb and PtMnSb. The magnetic materials of the pinned layer and the free layer may contain non-magnetic elements such as Ag, Cu, Au, Al, Mg, Si, Bi, Ta, B, C, O, N, Pd, Pt, Zr, Ir, W, Mo, and Nb, as long as the materials as a whole do not lose their ferromagnetism.

It is preferable to use FeMn, PtMn, PtCrMn, NiMn, IrMn, NiO, $Fe_2O_3$, etc., as the material of an antiferromagnetic layer forming a part of the pinned layer.

The material of the tunnel barrier film may be, for example, magnesium oxide having coherent tunneling effect or a stacked film of magnesium and magnesium oxide. Furthermore, the material of the tunnel barrier film may be, for example, dielectrics such as $Al_2O_3$, $SiO_2$, AlN, $Bi_2O_3$, $MgF_2$, $CaF_2$, $SrTiO_2$, and $AlLaO_3$, and the like. These dielectrics may contain oxygen and nitrogen or may be lacking in fluorine.

[Perpendicular Magnetization Type Magnetic Tunnel Junction]

When the MTJ is a perpendicular magnetization type magnetic tunnel junction, it is preferable that the material of the pinned layer be composed of a material with a high magnetic anisotropy energy density of $1 \times 10^6$ erg/cc or more. For example, the material of the pinned layer is composed of an alloy containing at least one of Fe, Co, and Ni and at least one of Cr, Pt, and Pd. Ordered alloys that can be the material of the pinned layer include $Fe_{(50)}Pt_{(50)}$, $Fe_{(50)}Pd_{(50)}$, and $Co_{(50)}Pt_{(50)}$, and the like. Disordered alloys that can be the material of the pinned layer include a CoCr alloy, a CoPt alloy, a CoCrPt alloy, a CoCrPtTa alloy, and a CoCrNb alloy, and the like.

Furthermore, the material of the pinned layer may be a stacked film in which at least one of Fe, Co, and Ni or an alloy containing one of them and one of Pd and Pt or an alloy containing one of them are deposited alternately. In specific examples, the material of the pinned layer includes a Co/Pt artificial lattice, a Co/Pd artificial lattice, and a CoCr/Pt artificial lattice. In the case of using a Co/Pt artificial lattice and the case of using a Co/Pd artificial lattice, the resistance change rate (MR ratio) is as high as about 40%.

Furthermore, the material of the pinned layer may be an amorphous alloy containing at least one of rare-earth metals, e.g., Tb (terbium), Dy (dysprosium), or Gd (gadolinium), and at least one of transition metals. In specific examples, the material of the pinned layer includes TbFe, TbCo, TbFeCo, DyTbFeCo, and GdTbCo, and the like.

The material of the free layer may be the same as that of the above-described pinned layer. However, the material of the free layer may be composed of a magnetic material whose magnetic anisotropy energy density is made lower than the material of the above-described pinned layer by, for example, adjusting the composition ratio, adding an impurity, or adjusting the thickness. For example, the material of the free layer may be a material obtained by adding an impurity to an alloy containing at least one of Fe, Co, and Ni and at least one of Cr, Pt, and Pd. In a specific example, an ordered alloy that can be the material of the free layer may be a material whose magnetic anisotropy energy density is reduced by adding an impurity such as Cu, Cr, or Ag, and the like, to $Fe_{(50)}Pt_{(50)}$, $Fe_{(50)}Pd_{(50)}$, or $Co_{(50)}Pt_{(50)}$. A disordered alloy that can be the material of the free layer may be a material whose magnetic anisotropy energy density is reduced by increasing the proportion of a non-magnetic element in a CoCr alloy, a CoPt alloy, a CoCrPt alloy, a CoCrPtTa alloy, or a CoCrNb alloy.

Furthermore, the material of the free layer may be a stacked film in which a layer (first layer) of at least one of Fe, Co, and Ni or an alloy containing one of them and a layer (second layer) of one of Pd and Pt or an alloy containing one of them are stacked alternately. In this case, there is a need to adjust the thickness of the first layer or the thickness of the second layer. For example, each of the first and second layers has a film thickness value at which the magnetic anisotropy energy density is maximized. As the film thicknesses of the first and second layers deviate from their film thickness values at which the magnetic anisotropy energy density is maximized, the magnetic anisotropy energy densities of the respective first and second layers decrease.

Furthermore, the material of the free layer may be an amorphous alloy containing at least one of rare-earth metals, e.g., Tb (terbium), Dy (dysprosium), or Gd (gadolinium), and at least one of transition metals. In specific examples, the material of the free layer includes amorphous alloys such as TbFe, TbCo, TbFeCo, DyTbFeCo, and GdTbCo. At this time, by adjusting the composition ratio of an amorphous alloy, the magnetic anisotropy energy density is reduced.

When, for example, a Co/Pt artificial lattice is used for the free layer, by adjusting the film thicknesses of a Co film and a Pt film, the coercive force of the MTJ element can be adjusted.

When, for example, an ordered alloy such as FePt or CoPt is used for the pinned layer, in order to cause perpendicular magnetic anisotropy, the fct (001) plane of the pinned layer needs to be oriented. Hence, it is preferable to add, as a crystal orientation control layer, an extremely thin underlayer composed of MgO with a thickness of several nanometers. In addition to MgO, the material of the pinned layer may be an element or a compound (e.g., Pt, Pd, Ag, Au, Al, Cu, Cr, Fe, or an alloy thereof) having an fcc structure or bcc structure with a lattice constant of the order of 2.8 angstrom, 4.0 angstrom, or 5.6 angstrom.

When the MTJ has a bottom pin (top free) structure, a crystal orientation control layer is disposed between the lower electrode layer and the pinned layer (pin layer). A buffer layer composed of, for example, Ta, TiN, TaN, etc., may be disposed between the crystal orientation control layer and the lower electrode layer. When the MTJ has a top pin (bottom free) structure, it is preferable to use fcc (100) plane-oriented MgO for the tunnel barrier layer. In this case, the above-described crystal orientation control layer may be further stacked to the extent that the MTJ element does not deteriorate.

When an ordered alloy is used for the free layer, too, likewise, there is a need to orient the fct (001) plane of the free layer. In the case of the top pin (bottom free) structure, a crystal orientation control layer is disposed between the upper electrode layer and the pin layer. A buffer layer composed of, for example, Ta, TiN, TaN, etc., may be disposed between the crystal orientation control layer and a yoke material. In the case of the bottom pin (top free) structure, it is preferable to use fcc (100) plane-oriented MgO for the tunnel barrier layer. In this case, the above-described crystal orientation control layer may be further stacked to the extent that the MTJ element does not deteriorate.

To enhance the perpendicular magnetization characteristics of the pinned layer and the free layer, a soft magnetic layer such as layer of CoFeB or an Fe single layer may be inserted between the pinned layer and the tunnel barrier layer and/or between the free layer and the tunnel barrier film. The MTJ element is composed of materials such as those described above.

The upper electrode UE is provided on the MTJ element. The material of the upper electrode UE is a conductive material and may be, for example, a single or stacked layer of any of Ta, Ti, TiAlxNy, TaN, WN, W, TiN, and Ru. A growth layer 30 which is epitaxially grown using the upper electrode UE as a seed is provided on the upper electrode UE. The material of the growth layer 30 may be, for example, tungsten or a metal material or a semiconductor material which is grown by CVD using an inorganic-based, halide- or fluoride-based source gas. The growth layer 30 is composed of, for example, a conductive material such as Ru, Si, or Ge, in addition to W. In addition, the material of the growth layer 30 may be the same as that of the upper electrode UE.

The bit line BL is provided on the growth layer 30 and is electrically connected to the upper electrode UE through the growth layer 30.

The word line WL and the bit line BL intersect each other, and the memory cell MC is provided at the intersection of the word line WL and the bit line BL. By this, in a read or write operation, a certain memory cell MC can be selected by a corresponding word line WL and a corresponding bit line BL and data can be read from the selected memory cell MC or data can be written to the selected memory cell MC.

The magnetization direction of the pinned layer of the MTJ element is fixed. Thus, the MTJ element stores data according to the magnetization direction of the free layer. The MTJ element can take a low resistance state and a high resistance state, according to the magnetization alignment of two ferromagnetic layers. For example, when the low resistance state is defined as data "0" and the high resistance state is defined as data "1", 1-bit data can be recorded in the MTJ element.

Figure 2A:
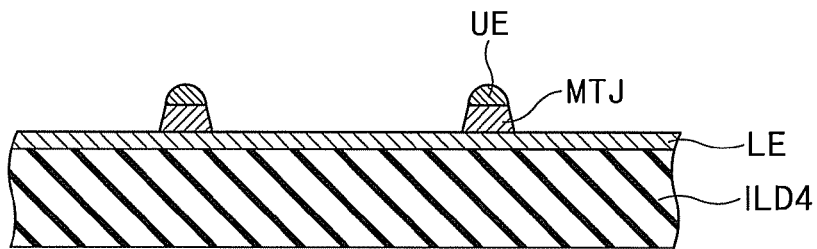
FIGS. 2A to 2E are cross-sectional views showing a method of manufacturing an MRAM according to the first embodiment.
Figure 2B:
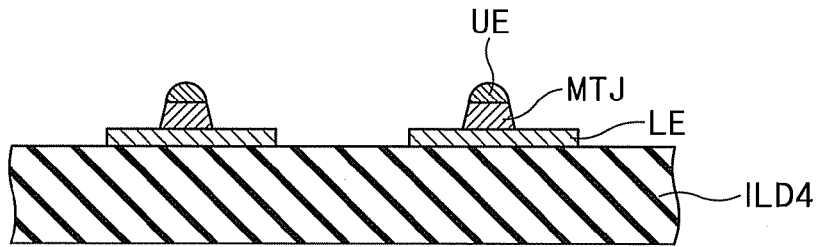
Figure 2C:
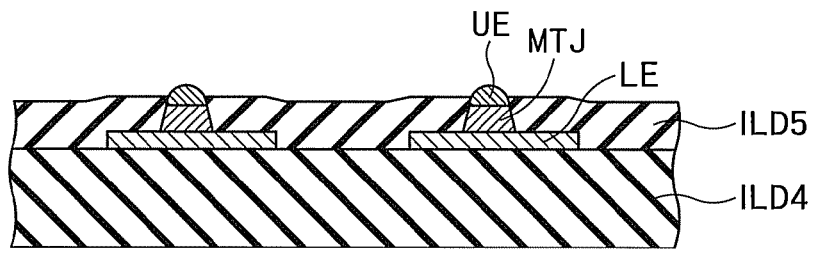
Figure 2D:
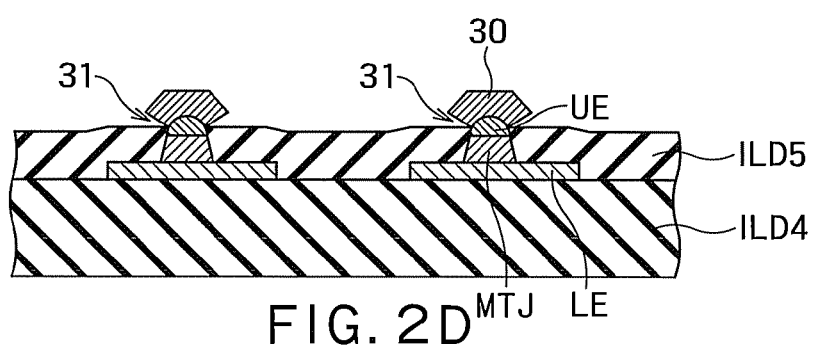
Figure 2E:
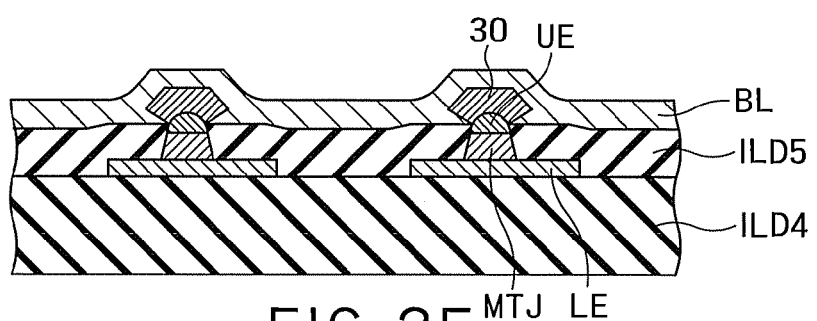

Note that although FIG. 1 shows the MTJ element, the upper electrode UE, and the growth layer 30 in a simplified manner, they have cross-sectional configurations such as those shown in FIG. 2E.

FIGS. 2A to 2E are cross-sectional views showing a method of manufacturing an MRAM according to the first embodiment. FIGS. 2A to 2E mainly show the formation of an MTJ element, and depiction of the formation of a selection transistor ST, contacts CD1 to CD4 and CS, and wiring lines (M1 to M3) is omitted.

First, a semiconductor substrate 10 such as a silicon substrate shown in FIG. 1 is prepared. An STI 20 is formed in the semiconductor substrate 10 and a selection transistor ST is formed in an active area. An interlayer dielectric film ILD1 is deposited to cover the selection transistor ST, and a surface of the interlayer dielectric film ILD1 is flattened. Then, contacts CS and CD1 which reach a source S and a drain D of the selection transistor ST, respectively, are formed in the interlayer dielectric film ILD1.

Furthermore, a metal wiring layer M1 is deposited and is processed using lithography and RIE (Reactive Ion Etching). By this, a source line SL and another line (M1) are formed. Thereafter, by repeating the deposition of an interlayer dielectric film, the formation of a contact, and the formation of a wiring, a multilayer wiring structure (M1 to M3, CD1 to CD4, CS, and ILD1 to ILD4) shown in FIG. 1 is formed. Upon the formation of contacts CD1 to CD4 and CS, and wirings (M1 to M3), a barrier metal (e.g., Ti and TiN) may be formed and then a wiring material (e.g., tungsten) may be deposited. In this case, upon processing the wiring material, the barrier metal is also simultaneously processed as a part of the wiring.

Then, a material of a lower electrode LE is deposited on the interlayer dielectric film ILD4 and the contact CD4. An MTJ element is formed on the material of a lower electrode LE. A method of forming an MTJ element is as follows.

First, a material of a pinned layer, a material of a tunnel barrier film, and a material of a free layer are deposited in this order. Those materials are as described above. Then, a material of a hard mask (not shown) is deposited on the materials of an MTJ element. The material of a hard mask is, for example, $SiO_2$ and SiN. The material of a hard mask is processed into a plane pattern of an MTJ element. Then, using the hard mask as a mask, the materials of an MTJ element are processed by RIE (Reactive Ion Etching), etc. By this, an MTJ element is formed. The processing of the materials of an MTJ element uses techniques including physical etching. Therefore, it is difficult to take a high etching selection ratio of the materials of an MTJ element or there is a risk that the interlayer dielectric film ILD4 which is the layer below the MTJ element may be largely etched upon overetching. Hence, the material of a lower electrode LE is used as an etching stopper. By this, a structure shown in FIG. 2A is obtained.

Then, as shown in FIG. 2B, the material of a lower electrode LE is processed using lithography and RIE, thereby forming a lower electrode LE. By this, an adjacent memory cell MC is electrically isolated.

Then, a material of an interlayer dielectric film ILD5 is deposited to cover an upper electrode UE, the MTJ element, and the lower electrode LE. Then, the interlayer dielectric film ILD5 is etched back using CMP and/or CDE (Chemical Dry Etching), etc., until a top surface of the MTJ element is exposed. At this time, a top surface of the upper electrode UE should be exposed from the interlayer dielectric film ILD5. Namely, the area of the exposed top surface may have a size insufficient for electrical connection between a bit line BL and the MTJ element. This is because after this a growth layer 30 is formed on the upper electrode UE. On the other hand, to suppress a short-circuit between the upper electrode UE and the lower electrode LE, the film thickness of the interlayer dielectric film ILD5 is preferably as thick as possible. The film thickness of the interlayer dielectric film ILD5 is slightly smaller than the height of the MTJ element and the upper electrode UE. By this, a structure shown in FIG. 2C is obtained.

Then, as shown in FIG. 2D, a growth layer 30 (e.g., tungsten) with a thickness of about several hundred angstrom is grown on the upper electrode UE (e.g., tantalum) using a metal CVD (Chemical Vapor Deposition) technique. At this time, the growth layer 30 is formed by epitaxial growth using the exposed portion of the top surface of the upper electrode UE as a seed. That is, the growth layer 30 is selectively grown on the exposed top surface of the upper electrode UE.

At this time, as shown in FIG. 2D, the growth layer 30 grows in an upward direction and a lateral direction from the top surface of the upper electrode UE serving as a seed for the epitaxial growth. Therefore, even if the area of the exposed top surface of the upper electrode UE is not sufficiently large for electrical connection between the bit line BL and the MTJ element, it is OK as long as the growth layer 30 grows to a size sufficient for electrical connection between the bit line BL and the MTJ element. By this, the bit line BL can secure a sufficient area of contact with the upper electrode UE, and can consequently be connected at a low contact resistance.

Figure 3:
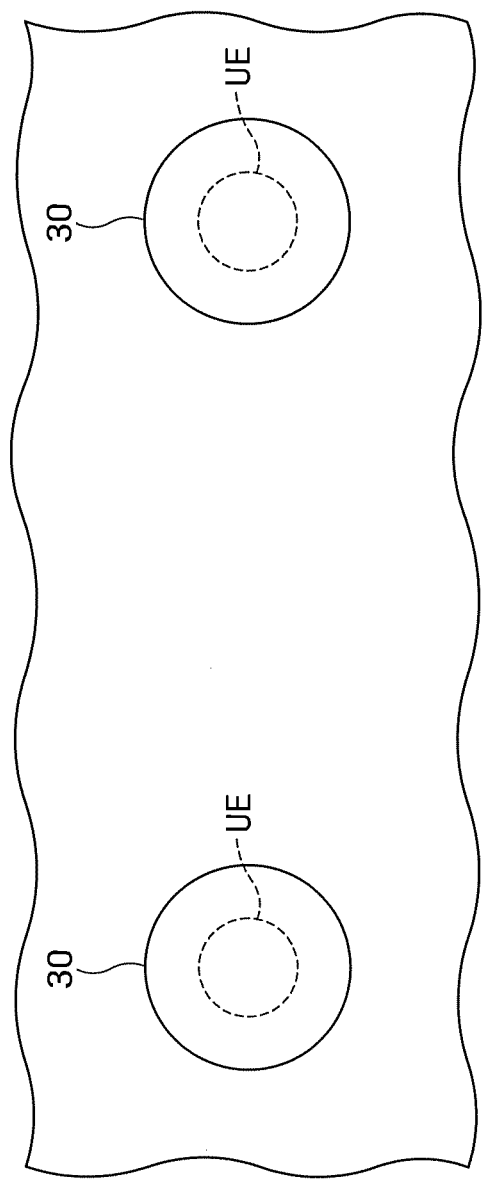
FIG. 3 is a diagram showing the outer edges of the growth layer 30 and the upper electrode UE when viewed from above the surface of the semiconductor substrate 10.

FIG. 3 is a diagram showing the outer edges of the growth layer 30 and the upper electrode UE when viewed from above the surface of the semiconductor substrate 10. It is preferable that, as shown in FIG. 3, the outer edge of the growth layer 30 be outside the outer edge of the upper electrode UE when viewed from above the surface of the semiconductor substrate 10. Specifically, when viewed from above the surface of the semiconductor substrate 10, the area of the growth layer 30 is larger than the area of the upper electrode UE and the growth layer 30 encompasses the upper electrode UE. As such, in order that the growth layer 30 encompasses the upper electrode UE, the growth layer 30 grows to spread in a horizontal direction to the surface of the semiconductor substrate 10 from the top surface of the upper electrode UE. Thus, as shown in FIG. 2D, the growth layer 30 has an inverted taper 31 at its side.

Then, as shown in FIG. 2E, a material of a bit line BL is deposited on the interlayer dielectric film ILD5. A bit line BL is formed by, for example, forming Ti and TiN as a barrier metal and thereafter depositing Cu-added Al and then processing the material of a bit line BL using lithography and RIE. By this, a bit line BL which is electrically connected to the growth layer 30 is formed. At this time, as shown in FIG. 2E, the bit line BL is in contact not only with a top surface of the growth layer 30 but also with the side of the growth layer 30 having the inverted taper 31. Given that a certain surface of the inverted taper 31 is a back-side surface, it can be said, in other words, that the bit line BL is in contact not only with the top surface of the growth layer 30 but also with a part of the back-side surface. In this way, the area of contact between the bit line BL and the growth layer 30 is large and the contact resistance between the bit line BL and the growth layer 30 is sufficiently low and a contact failure is prevented.

As such, according to the present embodiment, a growth layer 30 is provided on a top surface of an upper electrode UE. The growth layer 30 grows three-dimensionally in a longitudinal direction and a lateral direction from the top surface of the upper electrode UE. By this, the area of contact between the upper electrode UE and the growth layer 30 increases, and thus, a contact failure between the upper electrode UE and a bit line BL can be suppressed. In addition, the area of the exposed top surface of the upper electrode UE may be smaller than conventional ones. Correspondingly, an interlayer dielectric film ILD5 can be formed to be thicker than conventional ones. Accordingly, the interlayer dielectric film ILD5 can improve the insulation property between the upper electrode UE and a lower electrode LE. As a result, an MRAM according to the present embodiment can achieve a finer MD element while suppressing a short-circuit between the upper electrode UE and the lower electrode LE or a contact failure between the upper electrode UE and the bit line BL.

Note that in a stage where, immediately after the upper electrode UE for the MD element is exposed by etching back the interlayer dielectric film ILD5, and in a condition that a growth layer 30 is not yet formed, the size of the exposed portion (opening portion) of the top surface of the upper electrode UE is small. Hence, there may be a case in which upper electrodes UEs for some MTJ elements are not exposed due to variations in process. In this case, since the exposed portions of the upper electrodes UEs are very small, normally, it is difficult to find out whether the upper electrodes UEs are exposed.

However, in the present embodiment, a growth layer 30 is formed when the top surface of the upper electrode UE is exposed, and a growth layer 30 is not formed when the top surface of the upper electrode UE is not exposed. As shown in FIG. 3, since the area of the growth layer 30 is larger than the area of the upper electrode UE when viewed from above the surface of the semiconductor substrate 10, whether the top surface of the upper electrode UE is exposed can be easily found out by visually checking whether a growth layer 30 is present or by testing whether a growth layer 30 is present, using a defect inspection apparatus (e.g., an optical inspection apparatus).

If a growth layer 30 is not grown on the top surface of the upper electrode UE, then by additionally etching back the interlayer dielectric film ILD5, the top surface of the upper electrode UE is exposed. Thereafter, a material of a growth layer 30 is selectively grown again on the top surface of the upper electrode UE. As such, by adding an exposure test of the upper electrode UE, etching back of the interlayer dielectric film ILD5, and formation of a growth layer 30, a contact failure between the bit line BL and the upper electrode UE can be fixed. By this, a memory cell MC that can be a defective bit can be fixed, turning it into a non-defective memory cell. As a result, an advantageous effect of an improvement in the yield of a memory cell array can be obtained.

Second Embodiment

FIGS. 4A to 4E are cross-sectional views showing a method of manufacturing an MRAM according to a second embodiment. FIGS. 4A to 4E mainly show the formation of an MTJ element, and depiction of the formation of a selection transistor ST, contacts CD1 to CD4 and CS, and wiring lines (M1 to M3) is omitted.

In the second embodiment, after covering a side of an MTJ element by a protective film 40, a growth layer 30 is formed. An interlayer dielectric film ILD5 is deposited after the formation of the growth layer 30. Other manufacturing steps in the second embodiment may be the same as corresponding ones in the first embodiment. An MRAM according to the second embodiment differs from an MRAM according to the first embodiment in that the protective film 40 is provided on the side of the MTJ element. Other configurations in the second embodiment may be the same as corresponding one in the first embodiment.

Figure 4A:
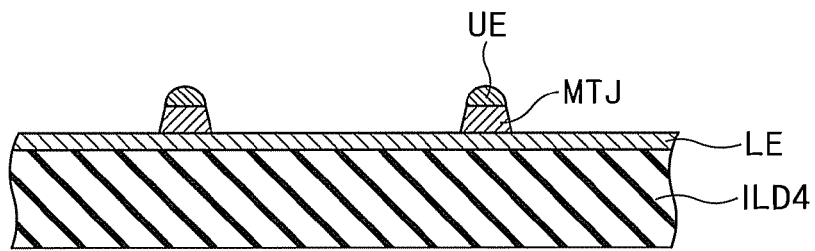
FIGS. 4A to 4E are cross-sectional views showing a method of manufacturing an MRAM according to a second embodiment.

A manufacturing method of the second embodiment will be described with reference to FIGS. 4A to 4E. First, as in the first embodiment, a selection transistor ST, a multilayer wiring structure (M1 to M3, CD1 to CD4, CS, and ILD1 to ILD4), and an MTJ element are formed on a semiconductor substrate 10. By this, a structure shown in FIG. 4A is obtained.

Figure 4B:
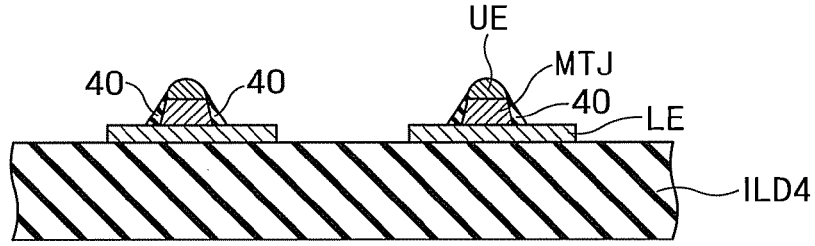

After forming an upper electrode UE and the MTJ element, a material of a protective film 40 is deposited on the materials of an MTJ element and a lower electrode LE. The material of a protective film 40 is, for example, an insulating film such as a silicon nitride film. Subsequently, the material of a protective film 40 is etched back using an anisotropic etching technique such as RIE, thereby forming a protective film 40 on a side of the MTJ element. At this time, at least a part of a top surface of the upper electrode UE is exposed. Then, the material of a lower electrode LE is processed using lithography and RIE, thereby forming a lower electrode LE. By this, a structure shown in FIG. 4B is obtained.

Figure 4C:
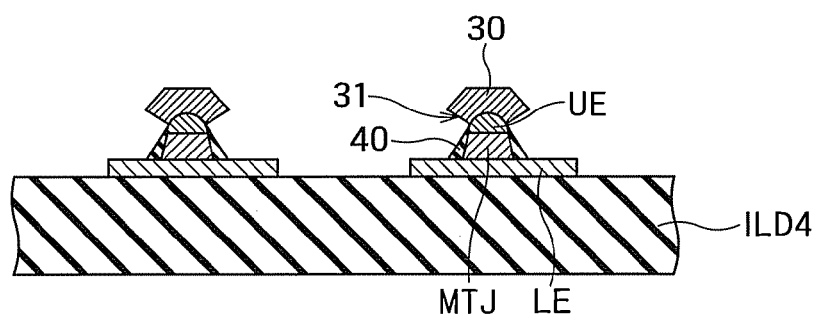

Then, as shown in FIG. 4C, a growth layer 30 (e.g., tungsten) with a thickness of about several hundred angstrom is grown on the upper electrode UE (e.g., tantalum) using a metal CVD technique. At this time, the growth layer 30 is formed by epitaxial growth using the exposed portion of the top surface of the upper electrode UE as a seed. That is, the growth layer 30 is selectively grown on the exposed top surface of the upper electrode UE.

At this time, in order that the growth layer 30 does not grow on the lower electrode LE, it is preferable that, while the material of the upper electrode UE be a metal material, the material of the lower electrode LE be an oxide or a nitride. For example, the material of the lower electrode LE may be TiN or TaN. By this, the incubation time of the growth layer 30 can be delayed in the lower electrode LE over the upper electrode UE. Since the growth layer 30 grows on the lower electrode LE in a delayed manner, by stopping an epitaxial step before the growth layer 30 epitaxially grows on the lower electrode LE, the growth layer 30 can be selectively epitaxially grown on the upper electrode UE.

It is preferable that, as shown in FIG. 3, an outer edge of the growth layer 30 be outside an outer edge of the upper electrode UE when viewed from above the surface of the semiconductor substrate 10. Specifically, when viewed from above the surface of the semiconductor substrate 10, the area of the growth layer 30 is larger than the area of the upper electrode UE and the growth layer 30 encompasses the upper electrode UE. As such, in order that the growth layer 30 encompasses the upper electrode UE, the growth layer 30 grows to spread in a horizontal direction to the surface of the semiconductor substrate 10 from the top surface of the upper electrode UE. Thus, as shown in FIG. 4C, the growth layer 30 has an inverted taper 31 at its side.

Figure 4D:
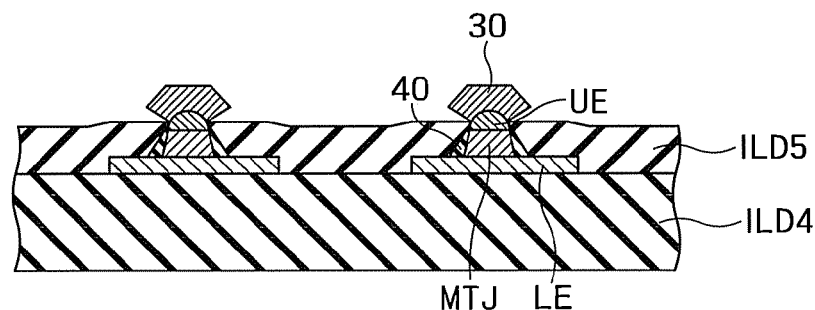

Then, as shown in FIG. 4D, an interlayer dielectric film ILD5 is deposited on the MTJ element, the protective film 40, the lower electrode LE, and the growth layer 30. Subsequently, the interlayer dielectric film ILD5 is etched back using CMP and/or RIE or a combined process thereof. By this, the growth layer 30 is exposed. At this time, a part of the upper electrode UE may be exposed.

Figure 4E:
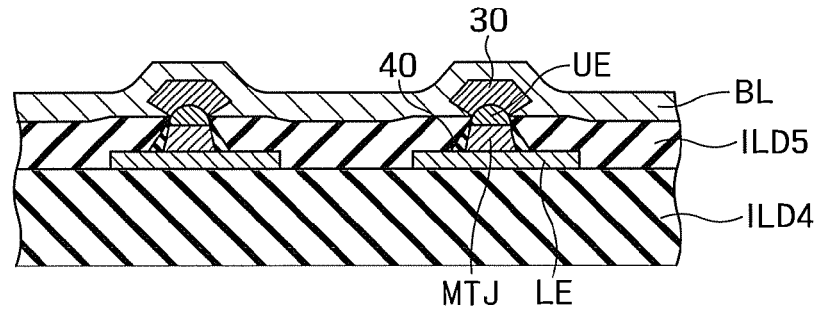

Then, as shown in FIG. 4E, a bit line BL is formed on the growth layer 30. The material of and formation method for the bit line BL may be the same as those of a bit line BL in the first embodiment.

As such, according to the second embodiment, a growth layer 30 is provided on a top surface of an upper electrode UE. The growth layer 30 grows three-dimensionally in a longitudinal direction and a lateral direction from the top surface of the upper electrode UE. By this, the area of contact between the upper electrode UE and the growth layer 30 increases, and thus, a contact failure between the upper electrode UE and a bit line BL can be suppressed. In addition, since the growth layer 30 grows three-dimensionally from the top surface of the upper electrode UE, an interlayer dielectric film ILD5 can be correspondingly formed to be thicker than conventional ones. Accordingly, the interlayer dielectric film ILD5 can improve the insulation property between the upper electrode UE and a lower electrode LE. As a result, an MRAM according to the second embodiment can also obtain the same advantageous effect as an MRAM according to the first embodiment.

Note that in a stage where, immediately after the upper electrode UE for the MTJ element is exposed by etching back the material of a protective film 40, a growth layer 30 is not yet formed, the size of the exposed portion (opening portion) of the top surface of the upper electrode UE is small. Hence, there may be a case in which upper electrodes UEs for some MTJ elements are not exposed due to variations in process. In this case, since the exposed portions of the upper electrodes UEs are very small, normally, it is difficult to find out whether the upper electrodes UEs are exposed.

However, in the second embodiment, a growth layer 30 is formed when the top surface of the upper electrode UE is exposed, and a growth layer 30 is not formed when the top surface of the upper electrode UE is not exposed. Therefore, whether the top surface of the upper electrode UE is exposed can be easily found out by visually checking whether a growth layer 30 is present or by testing whether a growth layer 30 is present, using a defect inspection apparatus.

If a growth layer 30 is not grown on the top surface of the upper electrode UE, then etching back of the interlayer dielectric film ILD5 and formation of a growth layer 30 are added. By this, a memory cell MC that can be a defective bit can be fixed, turning it into a non-defective memory cell. As a result, an advantageous effect of an improvement in the yield of a memory cell array can be obtained.

In the above-described embodiments, a bit line BL is deposited on a growth layer 30 and an interlayer dielectric film ILD5 and is thereafter processed using lithographic and etching techniques. However, a bit line BL may be formed using a damascene process. For example, though not shown, an insulating film is deposited on a growth layer 30 and an interlayer dielectric film ILD5, and a portion of the insulating film corresponding to a region where a bit line BL is formed is removed. By this, a groove is formed in the portion of the insulating film corresponding to the region where a bit line BL is formed, whereby the growth layer 30 is exposed. A material of a bit line BL is deposited in the groove and on the insulating film and is then polished using CMP. By this, a bit line BL embedded in the groove is formed. As such, by using a damascene process, too, a bit line BL can be formed on a growth layer 30.

In the above-described embodiments, a growth layer 30 may be a carbon nanotube. In this case, the material of an upper electrode UE is, for example, a transition metal such as NiCo or Co, and a carbon nanotube is grown on the upper electrode UE using plasma CVD.

(Modification)

A growth layer 30 can also be selectively formed not only by CVD but also by a plating process. In the case of using an electroplating process, the material to be plated as a growth layer 30 is, for example, a metal material such as Pt, Cu, or Au. On the other hand, the material of an upper electrode UE is, for example, TaN, TiN, etc. By this, while applying an electric field to the upper electrode UE and the plating material, the plating material can be selectively grown on the upper electrode UE.

In the case of using an electroless plating process, the material to be plated as a growth layer 30 is a material that can be deposited using a plating solution and is, for example, Cu, Ni, Zn, Cr, Sn, Ag, Au, etc. On the other hand, the material of an upper electrode UE to be plated is, for example, a noble metal such as Pt or Pd, and plating is performed in a state in which the surface is activated by such a noble metal.

The above-described embodiments can be applied not only to MRAMs but also to all other general magnetic recording type nonvolatile memories.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor storage device comprising:
selection elements on a surface of a semiconductor substrate;
lower electrodes connected to the selection elements;
magnetic tunnel junction elements on the lower electrodes;
upper electrodes on the magnetic tunnel junction elements;
growth layers on the upper electrodes, the growth layers being formed by using a conductive material and having larger areas than the upper electrodes when viewed from above the surface of the semiconductor substrate, the growth layers being selectively formed on the upper electrodes, separately, so as to correspond to the respective upper electrodes; and
a wiring on the growth layers.

2. The device according to claim 1, wherein outer edges of the growth layers are outside outer edges of the upper electrodes, respectively, when viewed from above the surface of the semiconductor substrate.

3. The device according to claim 1, wherein the wiring is in contact with top surfaces of the growth layers and side surfaces or parts of back-side surfaces of the growth layers.

4. The device according to claim 2, wherein the wiring is in contact with top surfaces of the growth layers and side surfaces or parts of back-side surfaces of the growth layers.

5. The device according to claim 1, further comprising a protective film configured to cover sides of the magnetic tunnel junction elements.

6. The device according to claim 2, further comprising a protective film configured to cover sides of the magnetic tunnel junction elements.

7. The device according to claim 3, further comprising a protective film configured to cover sides of the magnetic tunnel junction elements.

8. The device according to claim 5, wherein a material of the upper electrodes differs from a material of the lower electrodes.

9. The device according to claim 5, wherein the growth layers are formed by using a material that epitaxially grows on a material of the upper electrodes but does not epitaxially grow on a material of the lower electrodes.

10. A semiconductor storage device comprising:
selection elements on a surface of a semiconductor substrate;
lower electrodes connected to the selection elements;
magnetic tunnel junction elements on the lower electrodes;
upper electrodes on the magnetic tunnel junction elements;
growth layers on the upper electrodes, the growth layers being formed by using a conductive material; and
a wiring on the growth layers, wherein
the growth layers respectively correspond to the upper electrodes and are provided between the upper electrodes and the wiring, wherein
outer edges of the growth layers are outside outer edges of the upper electrodes, respectively, when viewed from above the surface of the semiconductor substrate.

11. A semiconductor storage device comprising:
selection elements on a surface of a semiconductor substrate;
lower electrodes connected to the selection elements;
magnetic tunnel junction elements on the lower electrodes;
upper electrodes on the magnetic tunnel junction elements;
growth layers on the upper electrodes, the growth layers being formed by using a conductive material; and
a wiring on the growth layers, wherein
the growth layers respectively correspond to the upper electrodes and are provided between the upper electrodes and the wiring, wherein
the wiring is in contact with top surfaces of the growth layers and side surfaces or parts of back-side surfaces of the growth layers.

12. The device according to claim 10, wherein the wiring is in contact with top surfaces of the growth layers and side surfaces or parts of back-side surfaces of the growth layers.

13. The device according to claim 10, further comprising a protective film configured to cover sides of the magnetic tunnel junction elements.

14. The device according to claim 11, further comprising a protective film configured to cover sides of the magnetic tunnel junction elements.

15. The device according to claim 13, wherein a material of the upper electrodes differs from a material of the lower electrodes.

16. The device according to claim 13, wherein the growth layers are formed by using a material that epitaxially grows on a material of the upper electrodes but does not epitaxially grow on a material of the lower electrodes.

17. The device according to claim 14, wherein a material of the upper electrodes differs form a material of the lower electrodes.

18. The device according to claim 14, wherein the growth layers are formed by using a material that epitaxially grows on a material of the upper electrodes but does not epitaxially grow on a material of the lower electrodes.

* * * * *